(12) United States Patent
Enjalbert

(10) Patent No.: US 8,482,099 B2
(45) Date of Patent: Jul. 9, 2013

(54) POLY-RESISTOR, AND LINEAR AMPLIFIER

(75) Inventor: Jerome Enjalbert, Fonsorbes (FR)

(73) Assignee: Freescale Semiconductor, Inc., Austin, TX (US)

( * ) Notice: Subject to any disclaimer, the term of this patent is extended or adjusted under 35 U.S.C. 154(b) by 264 days.

(21) Appl. No.: 12/933,208

(22) PCT Filed: Apr. 11, 2008

(86) PCT No.: PCT/IB2008/053125
§ 371 (c)(1),
(2), (4) Date: Sep. 17, 2010

(87) PCT Pub. No.: WO2009/125256
PCT Pub. Date: Oct. 15, 2009

(65) Prior Publication Data
US 2011/0018678 A1    Jan. 27, 2011

(51) Int. Cl.
*H01L 29/00*    (2006.01)
(52) U.S. Cl.
USPC ............ 257/538; 257/380; 438/382; 438/384

(58) Field of Classification Search
USPC .................................. 257/538, 380; 438/382
See application file for complete search history.

(56) References Cited

U.S. PATENT DOCUMENTS

| 5,329,155 A | 7/1994 | Lao et al. |
| 6,441,460 B1 | 8/2002 | Viebach |

FOREIGN PATENT DOCUMENTS

FR    2532473 A    3/1984

OTHER PUBLICATIONS

Vavelidis, Kostas et al: "Six-Terminal MOSFET's: Modeling and Applications in Highly Linear, Electronically Tunable Resistors" IEEE Journal of Solid-State Circuits, vol. 32, No. 1, Jan. 1997, pp. 4-9.
International Search Report and Written Opinion correlating to PCT/IB2008/053125 dated Dec. 3, 2008.

*Primary Examiner* — Long Pham

(57) ABSTRACT

The present invention provides a poly-resistor with an improved linearity. Majority charge carrier wells are provided under the poly-strips and are biased in such way that the non-linearity of the resistor is reduced. Further, when such poly-resistors are used in amplifier circuits, the gain of the amplifier remains constant against the poly-depletion effect.

18 Claims, 4 Drawing Sheets

POLY-RESISTOR, AND LINEAR AMPLIFIER

FIELD OF THE INVENTION

This invention relates to a poly-resistor, and to a linear amplifier.

BACKGROUND OF THE INVENTION

Poly-resistors are extensively used in integrated semiconductor chips. Poly-resistors are characterized by their sheet resistance values. In an effort to reduce the chip size, poly-resistors with high sheet resistance values are being fabricated in a small area. FIG. 1 schematically shows an example of a conventional poly-resistor 102 of the prior-art. Conventional poly-resistor 102 comprises a substrate layer 104, a dielectric layer 106 and a resistive strip 108. Resistor contacts 110 are provided on either sides of resistive strip 108. Resistive strip 108 is a poly-silicon strip. When a voltage is applied across resistor contacts 110 and substrate layer 104, depletion or accumulation of charge carriers occurs in the bottom portion of resistive strip 108 and upper portion of substrate layer 104, as shown by 110a and 110b, respectively. The depletion or accumulation of charge carriers depends upon the type of voltage applied. Thus, a parasitic MOS capacitance is formed across resistive strip 108 and substrate layer 104 due to the accumulation or depletion of the charge carriers. Hence, the conductivity of resistive strip 108 changes. In other words, the resistivity of resistive strip 108 changes. This effect is known as poly-depletion effect.

The poly-depletion effect is prominent in case of poly-resistors with high sheet resistance values. When a voltage is applied to a poly-resistor with high sheet resistance the poly-region gets depleted easily. Hence, its resistivity changes rapidly with a change in the voltage and such a poly-resistor exhibits a highly non-linear voltage-current behaviour. Further, when a conventional poly-resistor 102 is used in an amplifier circuit, the behaviour of the circuit is affected due to the poly-depletion effect. FIG. 2 schematically shows an example of an embodiment of an amplifier circuit 200, of the prior-art. Amplifier circuit 200 is an inverting amplifier circuit. Amplifier circuit 200 comprises operational amplifier 202, input conventional poly-resistor 102a and feedback conventional poly-resistor 102b. Input poly-resistor 102a is connected between input signal stage, $V_{in}$, and inverting terminal 204 of operational amplifier 202. Feedback poly-resistor 102b is connected between output terminal 208 and inverting terminal 204, at junction point 210. Non-inverting terminal 206 is either grounded or supplied with a fixed voltage.

As the gain of the amplifier circuit 200 is determined by the ratio of the resistances of input conventional poly-resistor 102a and feedback conventional poly-resistor 102b, the poly-depletion effect causes a non-constant gain of the amplifier circuit 200 when the input voltage $V_{in}$ changes. Hence, amplifier circuit 200 amplifies input signal $V_{in}$ with a large amount of distortion which degrades the quality of the output signal.

SUMMARY OF THE INVENTION

The present invention provides a poly-resistor and a linear amplifier as described in the accompanying claims.

Specific embodiments of the invention are set forth in the dependent claims. These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings, in which like references indicate similar elements. Elements in the FIG.s are illustrated for simplicity and clarity and have not necessarily been drawn to scale.

DETAILED DESCRIPTION OF THE PREFERRED EMBODIMENTS

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention and that the examples shown in the figures are merely for illustrative purposes.

Figure 1:
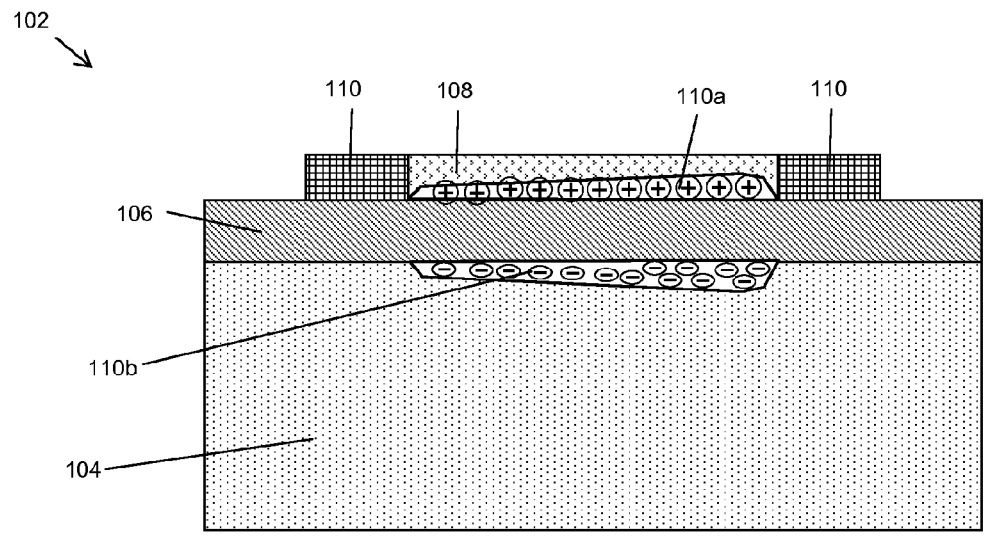
FIG. 1 schematically shows an example of a poly-resistor of the prior-art.
Figure 2:
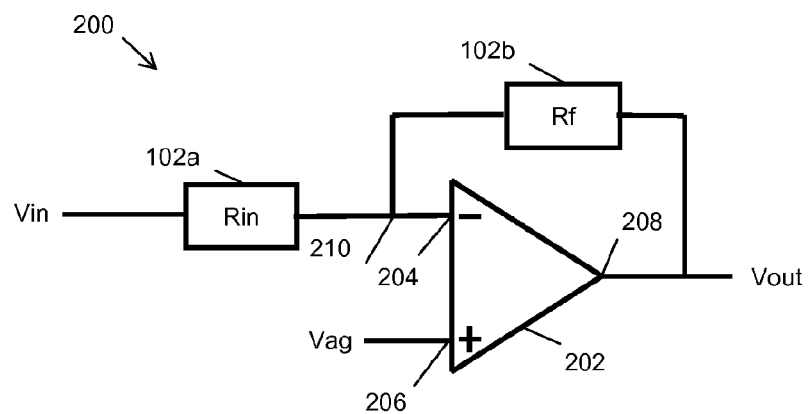
FIG. 2 schematically shows an example of an amplifier of the prior-art.
Figure 3:
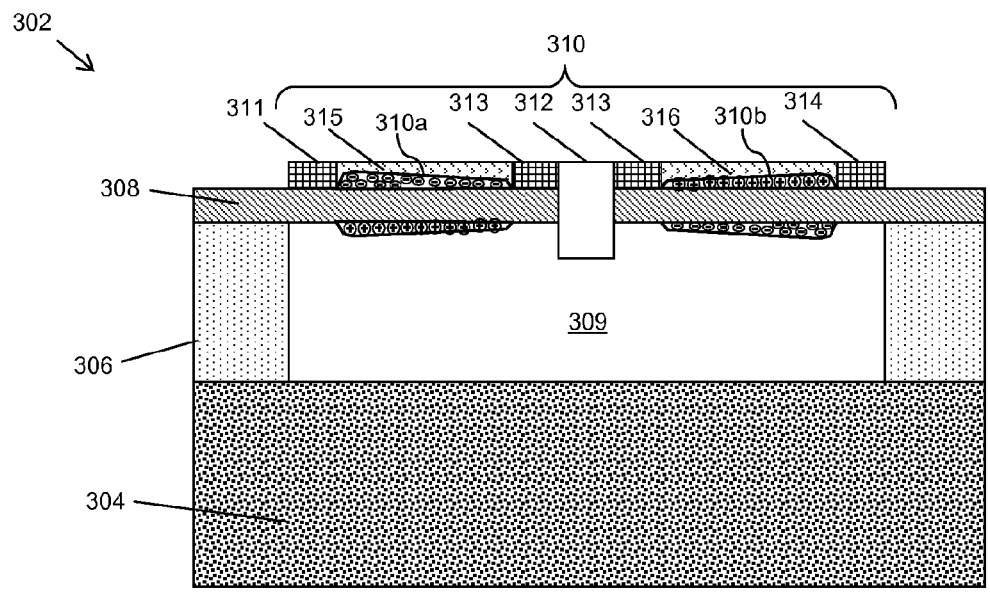
FIG. 3 schematically shows a cross sectional view of an example of an embodiment of a poly-resistor, taken along the line III-III shown in FIG. 4.

FIG. 3 schematically shows an example of an embodiment of a poly-resistor 302, in accordance with an embodiment of the present invention. The resistor 302 includes a resistive strip 310 which provides a resistive connection between resistor contacts 314 and 311. The strip 310 may be made of any suitable type of material, and for example be a poly-silicon strip.

As shown the resistive strip extends over at least a part of a (semi-)conductive region 309. A dielectric layer 308 isolates the (semi-)conductive region 309 from the resistive strip 310. The dielectric layer may be any suitable dielectric layer and may for example be a shallow trench isolation (STI) region extending over the (semi-)conductive region.

In this example, the (semi-)conductive region 309, the dielectric layer 308 and the resistive strip 310 are provided in a stacked formation. The dielectric layer 308 is provided on top of, in direct contact with, and in parallel to the surface of the (semi-)conductive region 309 and the resistive strip 310 is provided on top of, in direct contact with, and in parallel to the surface of the dielectric layer 308. As shown, the (semi-)conductive region 309 is provided in an intermediate layer which extends on top of a lower layer 304. In the example of FIG. 3, the intermediate layer and the lower layer 304 are provided in a substrate. The layers may for example be provided in the substrate by suitable implantation of a doping profile. However, alternatively (a part of) the lower layer 304 and/or the intermediate layer may have been provided on top of the substrate, for example by epitaxial growth or other deposition techniques.

Figure 5:
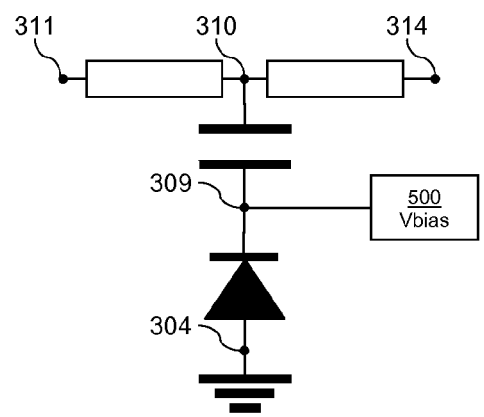
FIG. 5 shows a schematic electric circuit representation of the example of FIG. 3

As shown in the circuit representation of FIG. 5, a bias source 500 is connected to the (semi-)conductive region 309. In the circuit representation of FIG. 5, the capacitor represents the capacitance formed by the resistive layer 310, the dielectric layer 308 and the (semi-)conductive region 309. The bias source 500 can bias the (semi-)conductive region 309 to a voltage V3 which lies between a voltage V1 at the first resistor contact and a voltage V2 at the second resistor contact.

Without whishing to be bound to any theory, it is believed that as shown in FIG. 3 with reference numbers 310a,310b, due to the bias voltage, two opposite depletion effects occur, which cancel each other (at least partially). Accordingly, the conductivity of the resistive strip 310 is less dependent on the voltage between the first resistor contact 311 and the second resistor contact 314. More specific, a depletion region 310a will develop between the first resistor contact 311 and the location in the resistive strip 310 where the potential is the same as the potential to which the (semi-)conductive region 309 is biased. An accumulation region 310b which compensates for the depletion region 310a will develop between the second resistor contact 314 and the location in the resistive strip 310 where the potential is the same as the potential to which the (semi-)conductive region 309.

The bias source 500 may be implemented in any manner suitable for the specific implementation. The bias source may for example include an active bias source, e.g. connected to a separate voltage supply or other electronic circuits which supplies a suitable bias voltage to the (semi-)conductive region 309.

Alternatively, as in the example of FIG. 3 for instance, the bias source 500 may include a passive bias source. In the example of FIG. 3, the bias source 500 includes for example a conductive path 312 from the resistive strip 310 to the (semi-)conductive region. The conductive path may electrically connect a position at the resistive strip to the (semi-)conductive region 309. Thus, the (semi-)conductive region 309 will be biased, when the resistor 302 is used, to the potential of the resistive strip 310 at that position.

In the example of FIG. 3, the conductive path is provided by a conductive element 312, which is connected to the resistive strip at a position between the resistor contacts 314 and 311, and which connects the region 309 to that position. Thus, the region 309 is biased to the potential of the resistive strip 310 at that position. The conductive path may be connected such that, a first change in resistivity occurs in a part of the strip between the position and the first resistor contact and a second change in resistivity occurs in a part of the strip between the position and the second resistor contact, the second change at least partially compensating the first change, e.g. by the depletion effect indicated in FIG. 3 with 310a,310b. In the example of FIG. 3, the passage is provided, in a direction from the first end 311 to the second end 314, in the middle of the rectangular shape of the strip 310. The passage separates the resistive strip in a first part and a second part and the passage includes a conductive element which connects the first part to the second part and which conducive element is connected to the (semi-)conductive region.

In the example of FIG. 3, a distance between the position at which the conductive element 312 is connected to the resistive strip 310 and the first resistor contact 311 is substantially equal to a distance between the position and the second resistor contact 314. Thus, the changes in resistivity, believed to be caused by the depletion effect, cancel each other substantially completely.

Figure 4:
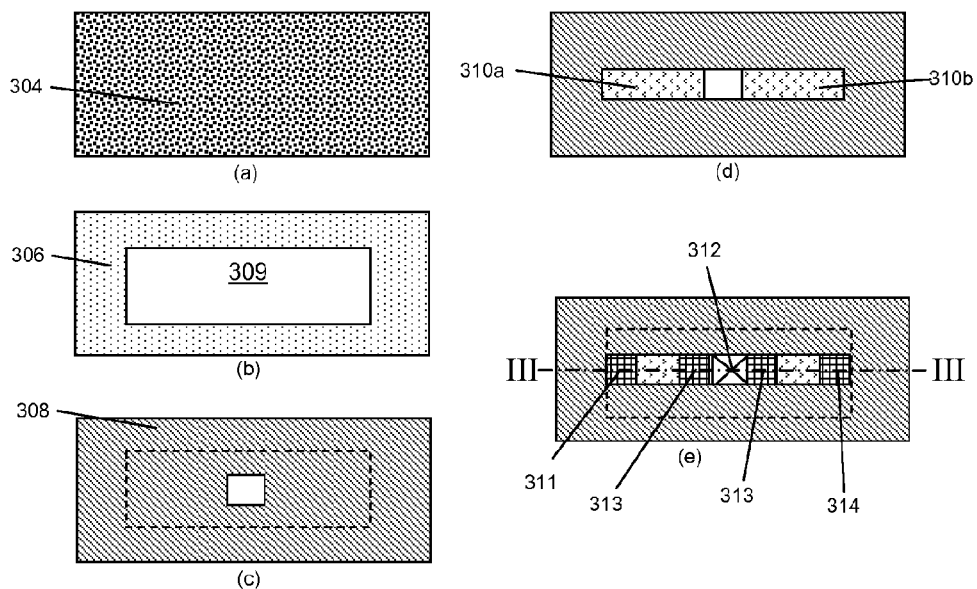
FIG. 4 schematically shows top views of the example of a poly-resistor illustrated in FIG. 3 during different stages of fabrication.
Figure 6:
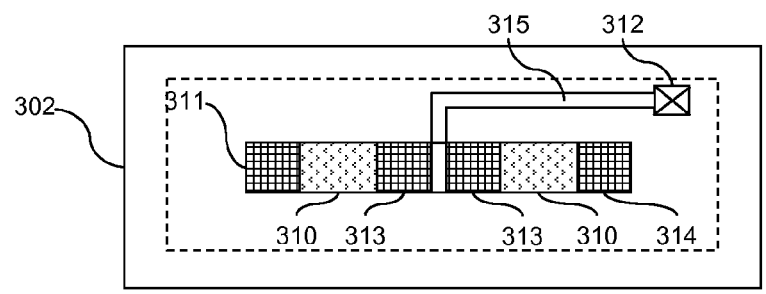
FIG. 6 schematically shows a top view of a second example of a poly-resistor

As shown in FIG. 3, the conductive path may include one, or more than one, passages through the dielectric layer 308, through which in this example the conductive element 312 extends. As shown in FIG. 4, for example, the passage may extend below the resistive strip 310 or as shown in FIG. 6, a conductive path 315 may be provided which connects a remote conductive element 312 to the respective location on the resistive strip 310.

The poly-resistor 302 may for example be manufactured as follows. A semi-conductive region may be formed over or in a substrate layer. The semi-conductive region 309 may include a semi-conductive material which may include a first type of majority charge carriers embedded in an embedding material 306 which may include second type of majority charge carriers. For instance in FIG. 3, the semi-conductive material is provided with an n-type doping and the embedding material is provided with a p-type doping or vice versa, while he lower layer 304, in the example the substrate bulk layer, may be p-type.

FIG. 4 schematically shows the top views of poly-resistor 302 during different stages (a) to (e) of fabrication, in accordance with an embodiment of the present invention. At stage (a), substrate layer 304 is provided. At stage (b), semi-conductive region 309 is provided over substrate layer 304. Semi-conductive region 309 includes a semi-conductive material which may include first type of majority charge carriers embedded in an embedding material which may include second type of majority charge carriers. For example, in an embodiment of the present invention, semi-conductive region 309 includes a semi-conductive material which may include n-type carriers embedded in an embedding material which may include p-type carriers. In another embodiment of the present invention, semi-conductive region 309 includes a semi-conductive material which may include p-type carriers embedded in an embedding material which may include n-type carriers. At stage (c), dielectric layer 308 is provided above semi-conductive region 309 exposing at least a part of the semi-conductive material which may include first type of majority charge carriers. At stage (d), resistive strips, 310a and 310b, are provided above dielectric layer 308, on either sides of the exposed semi-conductive region 309. At stage (e), conductive element 312 is provided to form a contact from resistive strips, 310a and 310b, to semi-conductive region 309. Resistor contacts 314 and 311 are also provided on either sides of resistive strips, 310a and 310b.

Figure 7:
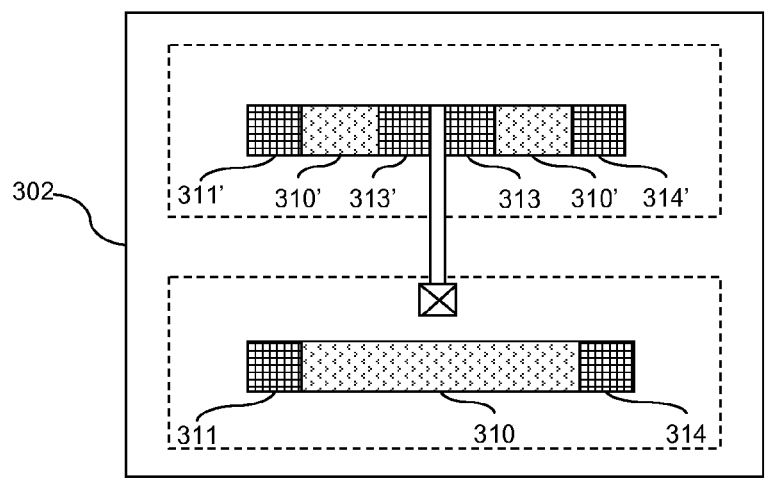
FIG. 7 schematically shows a top view of a third example of a poly-resistor

Referring to the example of FIG. 7, the bias source may include a second resistive strip 310' providing a resistive connection between two voltage points 311' and 314'. A conductive path may be provided from the second resistive strip 310' to the (semi-)conductive region 309. As shown in FIG. 7, the poly-resistor 302 may for example include two or more resistive strips which are spaced apart, for example with a dielectric medium, such as silicon dioxide or air between the strips. The voltage points 311' and 314' may for example be connected to the resistor contacts 311,314 or be provided with a suitable voltage from another source. The strips may all be separated from the (semi-)conductive region by the dielectric layer 308. In this example the bias voltage is provided from a different source than the resistive strip 310 of the poly-resistor 302.

In the example of FIG. 7, the bias source includes a conductive path which electrically connects the (semi-)conductive region 309 covered by a first resistive strip 310 to a position of another resistive strip 410. Thus, the (semi-)conductive region 309 is biased to the potential at that position. Thereby, the effect on the amplifier of a parasitic circuit formed by the (semi-)conductive region 309 and the substrate below the (semi-)conductive region 309 may be reduced.

Figure 8:
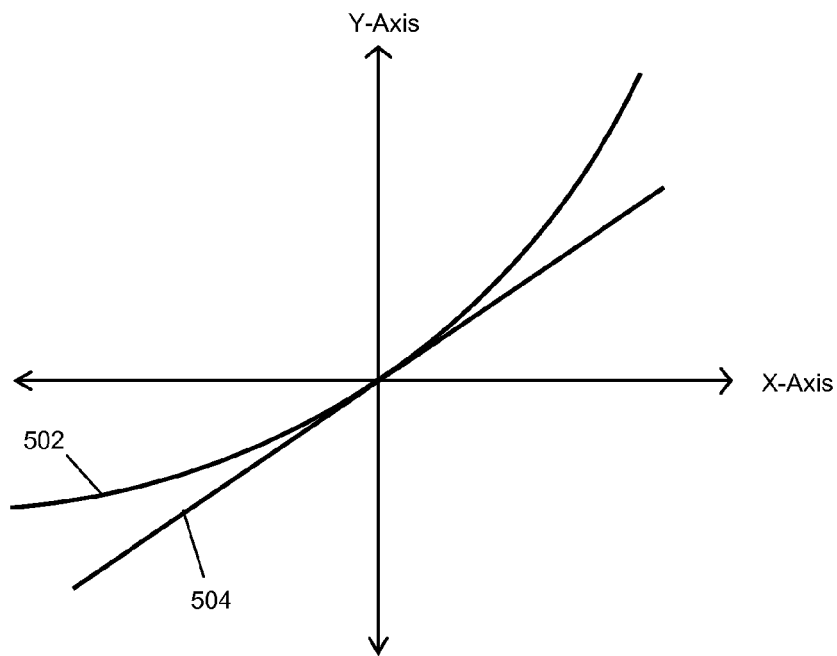
FIG. 8 schematically shows a graph illustrating the resistive behaviour of the example of a poly-resistor as shown in FIG. 3, versus conventional poly-resistor.

FIG. 8 schematically shows a graph illustrating the resistive behaviour of poly-resistor 302 versus conventional poly-resistor 102, in accordance with an embodiment of the present invention. The X-axis represents the voltage applied over the resistor contacts 311,314. The Y-axis represents the current flowing through the poly-resistor. Curve 502 represents the resistive behaviour of conventional poly-resistor 102. Curve 504 represents the resistive behaviour of poly-resistor 302.

Curve 502 shows that the resistivity of conventional poly-resistor 102 varies as the voltage changes. Thus, the current through the conventional poly-resistor 102 is non-linear with respect to the voltage.

Figure 9:
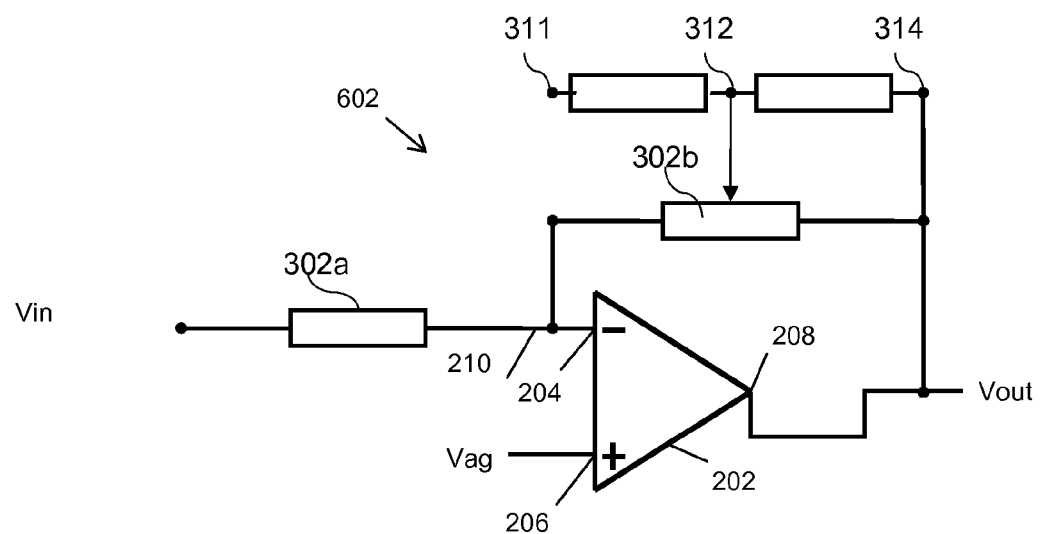
FIG. 9 schematically shows an example of an exemplary embodiment of a linear amplifier, in accordance with an embodiment of the present invention.

Curve 504 shows that the current of poly-resistor 302 remains almost linear as a function of the applied voltage, i.e. the resistance is almost constant FIG. 9 schematically shows an example of an embodiment of an amplifier circuit 602. The amplifier circuits 602 is an inverting amplifier circuit. The amplifier circuit 602 includes an amplifier 202, input poly-resistor 302a and feedback poly-resistor 302b. Input poly-resistor 302a is connected between input signal stage, $V_{in}$, and inverting terminal 204 of operational amplifier 202. Feedback poly-resistor 302b is connected between output terminal 208 and inverting terminal 204, at junction point 210. Non-inverting terminal 206 is either grounded or supplied with a fixed voltage.

When such a poly-resistor is used in an amplifier, the amplifier achieves a constant gain whatever the level of the input signal. The input and feedback poly-resistors of the amplifier, that determine the gain of the amplifier, exhibit a linear behaviour, and the change in the resistivity due to the poly-depletion effect is minimised.

The voltage difference between the midpoints of each of the input poly-resistor 302a and feedback poly-resistor 302b, and their respective semiconductive region underneath remains zero. Hence, even if input poly-resistor 302a and feedback poly-resistor 302b have different values, the effect of poly-depletion is cancelled or at least largely minimised on both the poly-resistors. Thus, the gain of linear amplifier 602, which is defined by the ratio of feedback and input resistance values, remains constant.

In various embodiments of the present invention, linear amplifier 602 may be a non-inverting amplifier. In a non-inverting amplifier, input voltage is applied to non-inverting terminal 206 and inverting terminal 204 is connected to a resistive network.

In the foregoing specification, the invention has been described with reference to specific examples of embodiments of the invention. It will, however, be evident that various modifications and changes may be made therein without departing from the broader spirit and scope of the invention as set forth in the appended claims. For example, the connections may be any type of connection suitable to transfer signals from or to the respective nodes, units or devices, for example via intermediate devices. Accordingly, unless implied or stated otherwise the connections may for example be direct connections or indirect connections. Also, the sheet resistance of the poly-resistor may have any suitable value and for example be in the range of 10Ω to 10 kΩ per square.

Furthermore, the semiconductor substrate described herein can be any semiconductor material or combinations of materials, such as gallium arsenide, silicon germanium, silicon-on-insulator (SOI), silicon, monocrystalline silicon, the like, and combinations of the above.

Also, for example, although the invention has been described with respect to specific conductivity types or polarity of potentials, skilled artisans appreciated that conductivity types and polarities of potentials may be reversed. Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the words 'a' and 'an' shall not be construed as limited to 'only one', but instead are used to mean 'at least one', and do not exclude a plurality. The mere fact that certain measures are recited in mutually different claims does not indicate that a combination of these measures cannot be used to advantage.

Unless stated otherwise, terms such as "first" and "second" are used to arbitrarily distinguish between the elements such terms describe. Thus, these terms are not necessarily intended to indicate temporal or other prioritization of such elements.

The invention claimed is:

1. A poly-resistor, comprising:
a first region wherein the first region is characterized as semiconductive or conductive;
a resistive strip providing a resistive connection between a first resistor contact and a second resistor contact; said resistive strip extending over at least a part of said first region;
a dielectric layer isolating said first region from said resistive strip; and
a bias source connected to said first region, for biasing said first region to a voltage which lies between a voltage at the first resistor contact and a voltage at the second resistor contact, said bias source including:
  a second resistive strip providing a resistive connection between a third resistor contact at which a first voltage can be applied and a forth resistor contact at which a second voltage can be applied; and
  a conductive path from said second resistive strip to said first region, for biasing said first region with a bias voltage between said first voltage and said second voltage.

2. A poly-resistor as claimed in claim 1, wherein said bias source includes a conductive path from said resistive strip to said first region.

3. A poly-resistor as claimed in claim 2, wherein said conductive path includes: at least one passage through said dielectric layer that electrically connects a position at said resistive strip to said first region, said conductive path for biasing said first region to a voltage of said position.

4. A poly-resistor as claimed in claim 3, wherein when said poly-resistor is in use, a first change in resistivity occurs in a part of said strip between said position and said first resistor contact and a second change in resistivity occurs in a part of said strip between said position and said second resistor contact, said second change at least partially compensating said first change.

5. A poly-resistor as claimed in claim 3, wherein a distance between said position and said first resistor contact is substantially equal to a distance between said position and said second resistor contact.

6. A poly-resistor as claimed in claim 1, wherein the first region is provided with an n-type doping and a material below the first region is provided with a p-type doping or vice versa.

7. A poly-resistor as claimed in claim 1, wherein said dielectric layer is a shallow trench isolation region extending over said first region.

8. A poly-resistor as claimed in claim 1, wherein said resistive strip is a poly-silicon strip.

9. A poly-resistor as claimed in claim 1, wherein the sheet resistance of the poly-resistor is in a range of $10\Omega$ to $10\ k\Omega$ per square.

10. A poly-resistor as claimed in claim 1, wherein said resistive strip has a rectangular shape and wherein said first resistor contact is provided at a first end of the rectangular shape and the second resistor contact is provided at a second end of the rectangular shape, opposite to the first edge.

11. A poly-resistor as claimed in claim 10, wherein a conductive element is provided, in a direction from the first end to the second end, in the middle of said rectangular shape.

12. A poly-resistor as claimed in claim 11, wherein said conductive element separates said resistive strip into a first part and a second part and is connected to said first region.

13. A poly-resistor as claimed in claim 1, including a substrate and, optionally at least one intermediate layer between said substrate and said dielectric layer, and wherein said first region is provided in said substrate and/or at least one of said at least one intermediate layer.

14. An integrated circuit including a poly-resistor as claimed in claim 1.

15. An amplifier circuit comprising:
an input for receiving input signal;
an amplifying stage including a stage input and a stage output;
a poly-resistor connected to said stage input and/or said output: and
an output connected to said stage output, for outputting an amplified signal; wherein the poly-resistor is a poly-resistor as claimed in claim 1.

16. A poly-resistor as claimed in claim 4, wherein a distance between said position and said first resistor contact is substantially equal to a distance between said position and said second resistor contact.

17. A poly-resistor as claimed in claim 2, wherein the first region is provided with an n-type doping and a material below the first region is provided with a p-type doping or vice versa.

18. A poly-resistor as claimed in claim 7 wherein said resistive strip is a poly-silicon strip.

* * * * *